United States Patent
Liu et al.

(10) Patent No.: US 11,088,270 B2
(45) Date of Patent: Aug. 10, 2021

(54) MICROWAVE TRANSISTOR WITH A PATTERNED GATE STRUCTURE AND MANUFACTURING METHOD THEREOF

(71) Applicant: XIAMEN SANAN INTEGRATED CIRCUIT CO., LTD., Xiamen (CN)

(72) Inventors: Shenghou Liu, Xiamen (CN); Nien-Tze Yeh, Xiamen (CN); Hou-Kuei Huang, Xiamen (CN)

(73) Assignee: XIAMEN SANAN INTEGRATED CIRCUIT CO., LTD. ., Xiamen (CN)

( * ) Notice: Subject to any disclaimer, the term of this patent is extended or adjusted under 35 U.S.C. 154(b) by 51 days.

(21) Appl. No.: 16/236,591

(22) Filed: Dec. 30, 2018

(65) Prior Publication Data
US 2019/0140087 A1 May 9, 2019

Related U.S. Application Data

(63) Continuation of application No. PCT/CN2017/090511, filed on Jun. 28, 2017.

(30) Foreign Application Priority Data

Jul. 4, 2016 (CN) .......................... 201610520962.9

(51) Int. Cl.
*H01L 29/778* (2006.01)
*H01L 21/28* (2006.01)
(Continued)

(52) U.S. Cl.
CPC .......... *H01L 29/7786* (2013.01); *H01L 21/28* (2013.01); *H01L 21/28581* (2013.01);
(Continued)

(58) Field of Classification Search
None
See application file for complete search history.

(56) References Cited

U.S. PATENT DOCUMENTS

| 7,449,730 | B2 * | 11/2008 | Kuraguchi | .......... H01L 29/0692 |
| | | | | 257/199 |
| 2016/0020313 | A1 * | 1/2016 | Wu | ..................... H01L 21/3081 |
| | | | | 257/194 |
| 2019/0259866 | A1 * | 8/2019 | Teo | ....................... H01L 29/205 |

FOREIGN PATENT DOCUMENTS

| CN | 101997029 A | 3/2011 |
| CN | 102947938 A | 2/2013 |

(Continued)

*Primary Examiner* — Steven M Christopher
(74) *Attorney, Agent, or Firm* — Syncoda LLC; Feng Ma

(57) ABSTRACT

A microwave transistor has a patterned region between a source and a drain on a barrier layer. Within the patterned region, the surface of the barrier layer partially recessed downwards in the thickness direction to form a plurality of grooves. A gate covers the patterned region. The length of the gate is greater than the lengths of the grooves in the length direction of the gate, so as to completely cover the grooves. In one aspect, by arranging the grooves, the gate control capability of a component is improved and the short-channel effect is suppressed; in another aspect, an original heterostructure below the gate is preserved; in this way, the reduction of the conductive capability due to the reduction of the two-dimensional electron gas density is avoided; and accordingly the current output capability of the component is ensured while the short-channel effect is suppressed.

15 Claims, 3 Drawing Sheets

(51) Int. Cl.
   *H01L 21/285*    (2006.01)
   *H01L 21/3213*   (2006.01)
   *H01L 23/66*     (2006.01)
   *H01L 29/205*    (2006.01)
   *H01L 29/423*    (2006.01)
   *H01L 29/47*     (2006.01)
   *H01L 29/66*     (2006.01)
   *H01L 29/20*     (2006.01)

(52) U.S. Cl.
   CPC ........ *H01L 21/32133* (2013.01); *H01L 23/66* (2013.01); *H01L 29/205* (2013.01); *H01L 29/42316* (2013.01); *H01L 29/475* (2013.01); *H01L 29/66462* (2013.01); *H01L 29/2003* (2013.01); *H01L 2223/6683* (2013.01)

(56) References Cited

FOREIGN PATENT DOCUMENTS

| | | |
|---|---|---|
| CN | 105609551 A | 5/2016 |
| CN | 205900552 U | 1/2017 |

\* cited by examiner

MICROWAVE TRANSISTOR WITH A PATTERNED GATE STRUCTURE AND MANUFACTURING METHOD THEREOF

CROSS-REFERENCE TO RELATED APPLICATIONS

The present application is a continuation of, and claims priority to, PCT/CN2017/090511 filed on Jun. 28, 2017, which claims priority to Chinese Patent Application No. 201610520962.9 filed on Jul. 4, 2016. The disclosures of these applications are hereby incorporated by reference in their entirety.

BACKGROUND

A high-electron-mobility transistor (HEMT) comprises a substrate, a buffer layer, a channel layer, a barrier layer, as well as a source electrode, a drain electrode and a gate electrode over the barrier layer. It is a two-dimensional electron gas layer (2-DEG) existing in the hetero-junction interface between the channel layer and the barrier layer. Varied gate voltage controls the electron concentration of 2-DEG between the source electrode and the drain electrode, thus controlling the operation state. As a new generation of transistor, HEMT is a preferred choice in applications requiring high frequency, voltage, temperature and power thanks to its excellent performance.

Based on conventional HEMT structures, the frequency performance of microwave devices is enhanced mainly depending on shrinking of gate length. Devices with 30-50 nm are available based on current technology. Typically, a barrier layer is about 20 nm thick. Hence, under this scale, the output power of device is limited due to challenging short-channel effect. Recess gate process is one way to enhance the gate controllability and inhibit short-channel effect. Namely, the entire barrier layer in the gate electrode area is thinned to shorten the distance from the gate electrode to the 2D electronic gas channel, thus enhancing the gate electrode's control over 2D electronic gas channel. However, as the barrier layer gets thinner, density of the 2D electronic gas density in the conducting channel decreases, thus limiting the maximum output power of the device. Another method is based on the structure design of channel array by removing the entire barrier layer under the gate electrode. Form a gate structure by covering the gate metal over the channel top and side walls at both sides, thus achieving the gate electrode's 3D control over the conducting channel, and thereby increasing the modulation capability over the channel. However, the conducting region under the electrode is removed, which fails to participate in electrical conduction, hence reducing the conducting capacity and output power of the device. Design of epitaxial structure is another method by growing a back barrier layer that is different from the component of the barrier layer under the channel, which strengthens the binding of 2D electronic gas in the channel and inhibits short channel effect of the device. Yet, this imposes extremely high requirements on the epitaxy technique, as different semiconductor crystal materials have different growth temperatures, and frequent switch of temperature would affect final quality of epitaxial materials. To sum up, the aforesaid methods cannot solve the existing problems.

SUMMARY

The purpose of the present invention is to overcome the defects of current technology by providing a microwave transistor with a patterned gate structure and manufacturing method thereof.

The technical schemes below are adopted in the present disclosure to solve the technical problems: A microwave transistor with a patterned gate structure comprises from bottom to top a substrate, a buffer layer, a channel layer and a barrier layer, wherein, the barrier layer is provided with a source electrode, a drain electrode and a gate electrode, and the gate electrode is between the source electrode and the drain electrode; the barrier layer has a patterned region between the source electrode and the drain electrode, and a plurality of grooves are arranged inside the patterned region, which are formed by recessing the barrier layer surface along the thickness direction; the gate electrode covers over the patterned region, and length of the gate electrode is larger than the length of these grooves along the gate electrode length so that the grooves can be completely covered.

Preferably, the grooves account for 25%-75% of the patterned region covered by the gate electrode.

Preferably, the grooves are strip structures and are horizontally arranged at equidistant spacing.

Preferably, thickness of the gate electrode at the bottom of a plurality of grooves is same as that over the barrier layer surface.

Preferably, the side walls of a plurality of grooves incline inwards the bottom direction of the grooves by 0-60 degrees, and the gate electrode covers the side walls of a plurality of grooves.

Preferably, the channel layer and the barrier layer are made of semiconductor materials capable for forming a heterojunction; the source electrode, the drain electrode and the gate electrode are made of metal; the source electrode forms ohmic contact with the drain electrode and the barrier layer; the gate electrode and the barrier layer form Schottky contact.

A method for manufacturing the microwave transistor with a patterned gate structure comprises:

(1) forming a buffer layer, a channel layer and a barrier layer in successive over the substrate;

(2) forming a source electrode and a drain electrode over the barrier layer surface;

(3) defining a patterned region between the source electrode and the drain electrode, and etching the barrier layer of the patterned region to form a plurality of grooves; and (4) forming a gate electrode over the patterned region, and length of the gate electrode is larger than the length of these grooves along the gate electrode length so that the grooves can be completely covered.

Preferably, step (2) includes the following substeps:

depositing a Ti/Al/Ni/Au multi-metal layer in two regions of the barrier layer respectively, wherein the thickness of the Ti/Al/Ni/Au is 20/150/50/100 nm respectively;

forming the source electrode and the drain electrode via ohmic contact by annealing under 800-950° C. for 20-45 s.

Preferably, the grooves in step (3) are formed by dry etching and/or wet etching.

Preferably, the gate electrode in step (4) is made of metal and is deposited over the patterned region via magnetron spattering, ion deposition or arc ion deposition and forms Schottky contact with the barrier layer.

The beneficial effects of the invention are that:

1. In this invention, a patterned region between the source electrode and the drain electrode, and a plurality of grooves are arranged inside the patterned region, which are formed by recessing the barrier layer surface along the thickness direction; the gate electrode covers over the patterned region, and length of the gate electrode is larger than the length of these grooves along the gate electrode length so that the grooves can be completely covered. On the one hand, the grooves can enhance the gate control capacity of the device and inhibit the short-channel effect; on the other hand, the original heterostructure under the gate electrode is maintained without compromising the conducting capacity and density decrease of the 2D electronic gas, thus inhibiting the short-channel effect while keeping the current output capacity of device and improve frequency performance of the microwave device.

2. The gate electrode covers the bottom and side wall of the groove, thus forming an annular gate structure. Therefore, the 2D electronic gas channel is under 3D control from the bottom and side wall, and the modulation capacity is further enhanced.

3. The process is simple and highly controllable, and requires no special process without compromising final quality of epitaxial material. Therefore, it is applicable for actual production.

DETAILED DESCRIPTION

Figure 1:
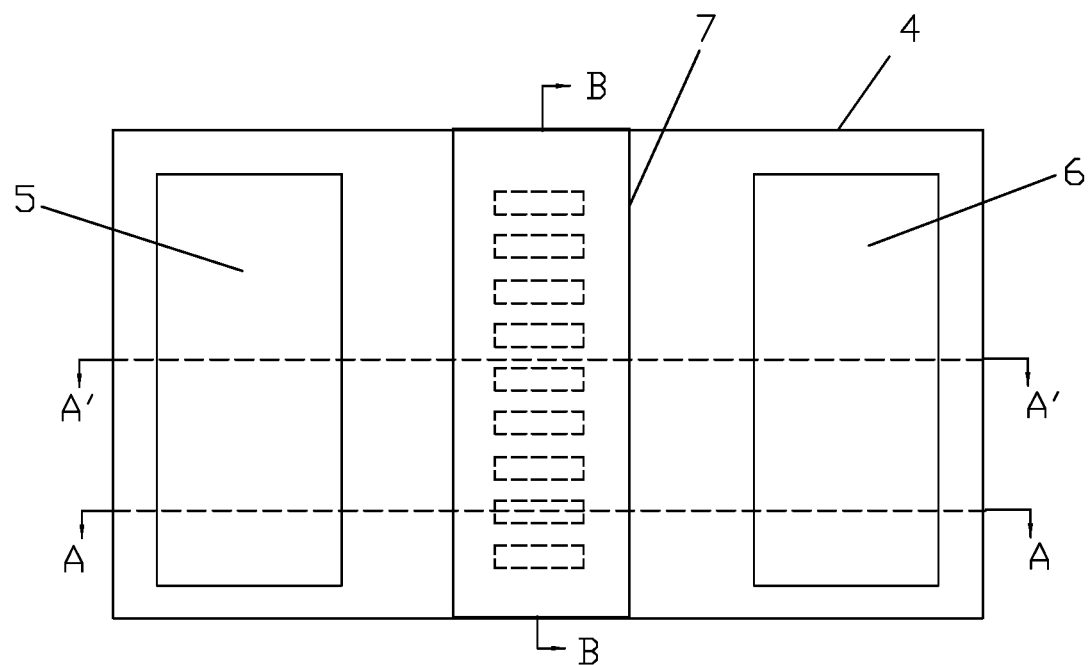
FIG. 1 is a top view diagram of one embodiment according to the present invention.

The present disclosure will be explained in details with reference to the accompanying drawings and embodiments. The drawings are only for illustration and better understanding of the present invention. The specific scale can be adjusted based on design requirements. Those skilled in the art should understand that the upper and lower positions as illustrated in the drawings are merely referred to relative positions of the components, which can be flipped to show same components, which should be also fallen into the scope of this specification. In addition, the number of components and structures illustrated in the diagram are only exemplary, which cannot be interpreted as limiting, which can be adjusted based on actual requirements.

Figure 2:
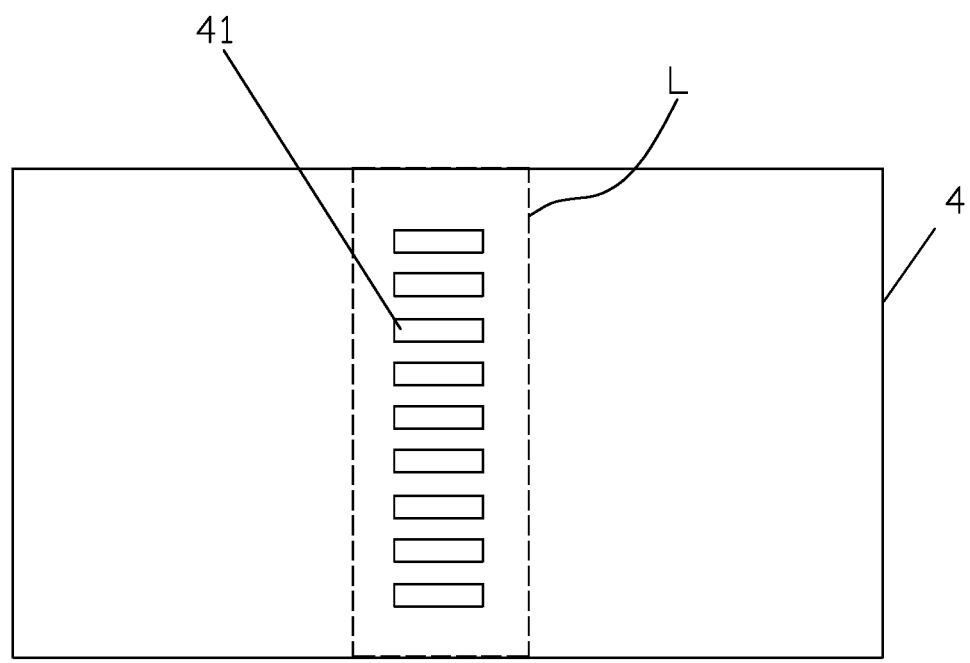
FIG. 2 is a top view structural diagram of the barrier layer of the embodiment of the present invention.
Figure 3:
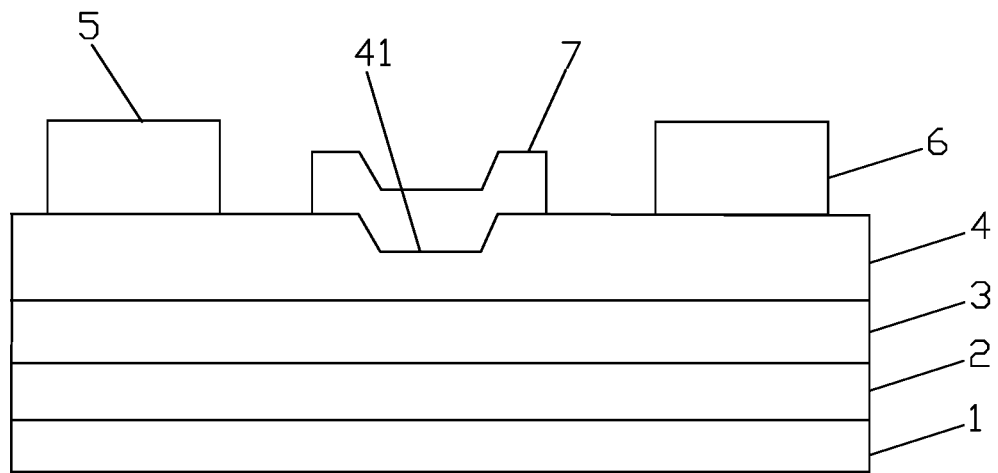
FIG. 3 is a schematic cross section along A-A direction of FIG. 1.
Figure 4:
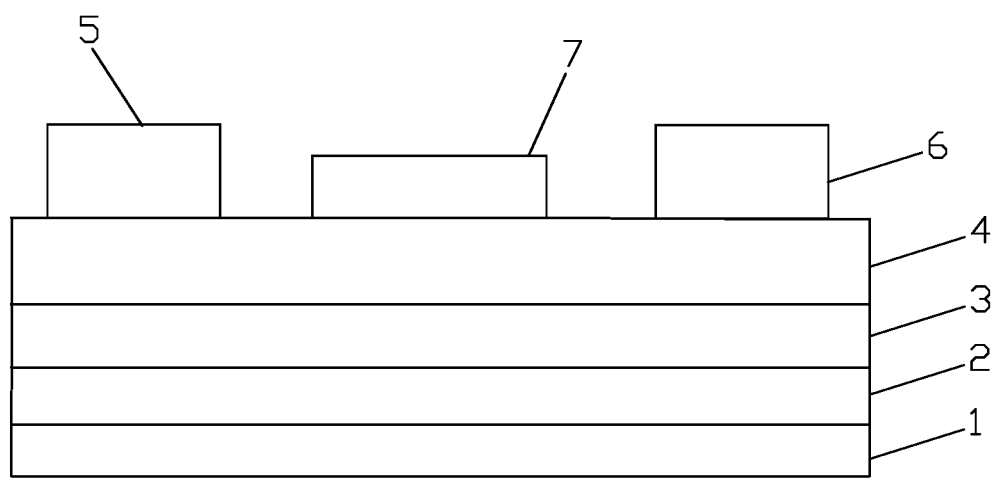
FIG. 4 is a schematic cross section along A'-A' direction of FIG. 1.
Figure 5:
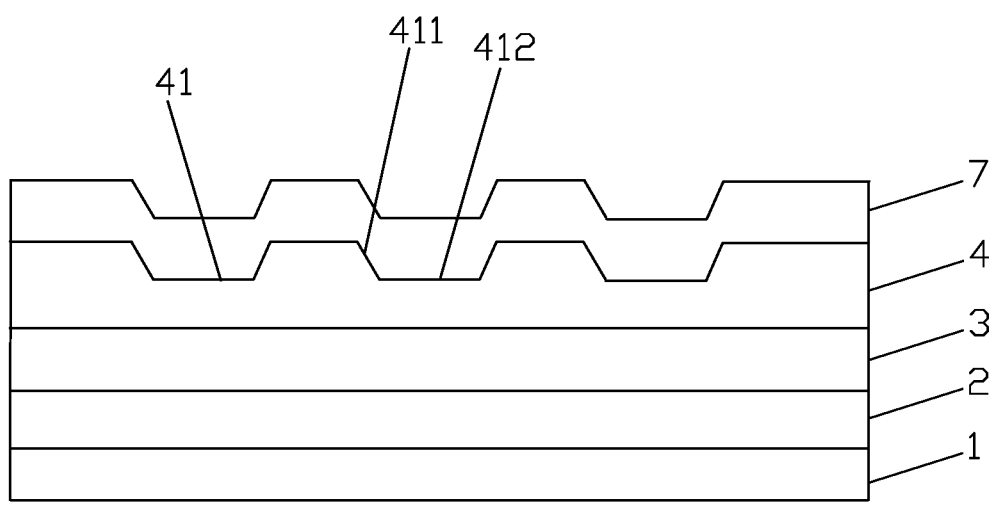
FIG. 5 is the schematic diagram of the sectional part along B-B direction in FIG. 1.

With references to FIGS. 1-5, the microwave transistor with a patterned gate structure of one embodiment comprises from bottom to up, a substrate 1, a buffer layer 2, a channel layer 3 and a barrier layer 4; wherein, the barrier layer 4 is provided with a source electrode 5, a drain electrode 6 and gate electrode 7, and the gate electrode 7 is between the source electrode 5 and the drain electrode 6. The gate electrode spanning from the source electrode to the drain electrode is length of the gate electrode, and the spanning of the gate electrode along the source electrode and the drain electrode is width of the gate electrode. Typically, it is considered that length direction of the gate electrode is vertical to width direction of the gate electrode. The barrier layer 4 has a patterned region L between the source electrode 5 and the drain electrode 6, and a plurality of grooves 41 are arranged inside the patterned region L, which are formed by recessing the barrier layer 4 surface along the thickness direction. The gate electrode 7 covers over the patterned region L, and length of the gate electrode is larger than the length of the groove 41 along the gate electrode length so that the groove 41 can be completely covered. Inside the groove 41, the distance between the gate electrode 7 and 2D electronic gas channel is narrowed, which improves control capacity of gate electrode over the 2D electronic gas channel; beyond the groove, the barrier layer of the gate electrode remains unchanged, so that density of the 2D electronic gas and the conducting capacity of the barrier layer are maintained so as to maintain the device output power.

In this embodiment, the grooves 41 are strip structures and are horizontally arranged at equidistant spacing along the gate width. The total area of these groove openings accounts for 25%-50% of the patterned region covered by gate electrode 7. For example, each groove 41 is 20 nm-40 nm long, and the width is same or approximate to the distance to the adjacent groove, thus forming an array arrangement. Length of the gate electrode is between 30 nm-50 nm, and a certain distance is between the side edges and the side walls of the groove, thus realizing complete coverage. The groove 41 is completely within the control scope of the gate electrode 7. If the gate electrode 7 cannot completely cover the groove 41, then, 2-DEG decrease of the groove 41 outside the gate electrode 7 cannot be controlled by the gate electrode 7, thus influencing the output power of the device. Then, the strip grooves can be arranged along the gate electrode length, or in oblique arrangement or multiple-column arrangement. The strip groove arrays are evenly arranged so that current is relatively distributed, thus avoiding overlarge partial current due to non-even distribution, which may cause over-high temperature of some part, which decreases device reliability. In addition, this is good for processing. In addition, based on actual requirements, the grooves can be in regular or irregular shape, which can be arranged in order or in disorder, or in other forms.

The side wall 411 of each groove 41 inclines inwards the groove by 0°-60° from the groove opening to the bottom 412. The gate electrode covers the side wall 411 and the bottom 412 of the groove 41, which realizes control cover the 2D electronic gas channel both in the vertical bottom direction and the oblique side wall direction, thus forming gate effect. The inclined side wall enhances the control capacity over the device and therefore improves the frequency performance of the device. Thickness of the electrode 7 over the groove bottom 412 is same as that over the barrier layer 4 surface. Due to the inclined side wall arrangement, the bending part is in obtuse angle, which avoids sharp-angled effect. The entire thickness is even and appears a surface form corresponding with the patterned region, making performance even and stable. For example, the barrier layer is about 20 nm thick, the groove 41 is about 10 nm deep, and the gate electrode is 500 nm thick with good synergistic effect.

The substrate and the buffer layer are of known materials and structures. For example, the substrate can be Si, SiC and sapphire. The buffer layer can be $Al_xGa_{1-x}N$, $0 \leq x \leq 1$. The channel layer 3 and the barrier layer 4 can be semiconductor materials capable for forming heterojunction, such as GaN/AlGaN and GaAs/AlGaAs. The source electrode 5 and the drain electrode 6 are metal and form ohmic contact with the barrier layer 4. The gate electrode 7 is also made of metal and forms Schottky contact with the barrier layer 4.

Manufacturing of the microwave transistor with a patterned gate structure is described below. Form a buffer layer 2, a channel layer 3 and a barrier layer 4 over the substrate 1 in successive. After cleaning, form a source electrode 5 and a drain electrode 6 over the barrier layer 4 by depositing Ti/Al/Ni/Au multi-metal layer over with E-beam Evaporator. Thickness of each layer is 20/150/50/100 nm. Then, anneal the layers under 850° C. for 30 s to form ohmic contact, thus forming a source electrode and a drain electrode. In addition, the source electrode and the drain electrode can also be other metals, alloys or laminated structures. Next, etch a groove over the barrier layer between the source electrode and the drain electrode, which can be achieved by dry etching, wet etching or their combination. Machines like RIE and ICP can be used for dry etching. The groove depth and the side wall inclination can be controlled by controlling etching power, pressure and air atmosphere. Solutions like sodium hydroxide and potassium hydroxide can be used for wet etching. The groove depth and the side wall inclination can be controlled by controlling solution concentration and etching time. Then, deposit a gate electrode over the patterned region. The gate electrode can be metal, and is deposited over the patterned region via magnetron spattering, ion deposition or arc ion deposition and forms Schottky contact.

The aforesaid embodiments are merely used for further description of the microwave transistor with a patterned gate structure and manufacturing method thereof according to the present invention. It should be understood that any simple variations, equivalent changes or modifications will fall within the scope of the disclosures without departing from the substantive features of the invention.

The invention claimed is:

1. A microwave transistor with a patterned gate structure, comprising:
   a substrate;
   a buffer layer;
   a channel layer; and
   a barrier layer,
   wherein:
   the barrier layer is provided with a source electrode, a drain electrode, and a gate electrode;
   the gate electrode is between the source electrode and the drain electrode;
   the barrier layer has a patterned region between the source electrode and the drain electrode;
   a plurality of grooves are arranged inside the patterned region and are formed by partially recessing the barrier layer surface along the thickness direction;
   the gate electrode is disposed over the patterned region and has a length larger than a length of the plurality of grooves along the gate electrode length such that the plurality of grooves are completely covered continuously by the gate electrode that has no gap therein; and
   the plurality of grooves are arranged in a width direction of the gate electrode, which is perpendicular to a length direction of the gate electrode, wherein the length direction extends between the source electrode and the drain electrode.

2. The microwave transistor of claim 1, wherein the plurality of grooves account for 25%-75% of an area of the patterned region covered by the gate electrode.

3. The microwave transistor of claim 1, wherein the plurality of grooves have strip structures and are horizontally arranged at equidistant spacing.

4. The microwave transistor of claim 1, wherein a thickness of the gate electrode at a bottom of a plurality of grooves is same as a thickness of the gate electrode over the barrier layer surface.

5. The microwave transistor of claim 1, wherein side walls of the plurality of grooves incline inwards towards a bottom direction of the plurality of grooves by 0-60 degrees, and the gate electrode covers the side walls of the plurality of grooves.

6. The microwave transistor of claim 1, wherein:
   the channel layer and the barrier layer are made of semiconductor materials capable for forming a heterojunction;
   the source electrode, the drain electrode and the gate electrode are made of metal; and
   the source electrode and drain electrode form ohmic contact with barrier layer; and
   the gate electrode and the barrier layer form Schottky contact.

7. A microwave transistor, comprising:
   a substrate;
   a buffer layer disposed over the substrate;
   a channel layer disposed over the buffer layer; and
   a barrier layer disposed over the channel layer,
   wherein:
   the barrier layer is provided with a source electrode, a drain electrode, and a gate electrode;
   the gate electrode is between the source electrode and the drain electrode;
   the barrier layer has a patterned region between the source electrode and the drain electrode;
   a plurality of grooves are arranged inside the patterned region and are formed by partially recessing the barrier layer surface along the thickness direction;
   the gate electrode is disposed over the patterned region and has a length larger than a length of the plurality of grooves along the gate electrode length such that the plurality of grooves are completely covered continuously by the gate electrode that has no gap therein; and
   the plurality of grooves are arranged in a width direction of the gate electrode, which is perpendicular to a length direction of the gate electrode, wherein the length direction extends between the source electrode and the drain electrode.

8. The microwave transistor of claim 7, wherein the microwave transistor is fabricated with a method including:
   (1) forming the buffer layer, the channel layer and the barrier layer over the substrate;
   (2) forming the source electrode and the drain electrode over the barrier layer surface;
   (3) defining the patterned region between the source electrode and the drain electrode, and etching the barrier layer of the patterned region to form the plurality of grooves;
   (4) forming the gate electrode over the patterned region, with the length of the gate electrode larger than the length of the plurality of grooves along the gate electrode length such that the grooves are completely and continuously covered.

9. The microwave transistor of claim 8, wherein: step (2) includes:
   depositing a Ti/Al/Ni/Au multi-metal layer in two regions of the barrier layer respectively, wherein thicknesses of the Ti/Al/Ni/Au are 20/150/50/100 nm, respectively;
   forming the source electrode and the drain electrode by annealing under 800-950° C. for 20-45 s.

10. The microwave transistor of claim 8, wherein the gate electrode in step (4) is made of metal and is deposited over the patterned region via magnetron spattering, ion deposition or arc ion deposition and forms Schottky contact with the barrier layer.

11. The microwave transistor of claim 8, wherein the plurality of grooves account for 25%-75% of an area of the patterned region covered by the gate electrode.

12. The microwave transistor of claim 8, wherein the plurality of grooves have strip structures and are horizontally arranged at equidistant spacing.

13. The microwave transistor of claim 8, wherein a thickness of the gate electrode at a bottom of a plurality of grooves is same as a thickness of the gate electrode over the barrier layer surface.

14. The microwave transistor of claim 8, wherein side walls of the plurality of grooves incline inwards towards a bottom direction of the plurality of grooves by 0-60 degrees, and the gate electrode covers the side walls of the plurality of grooves.

15. The microwave transistor of claim 8, wherein:
- the channel layer and the barrier layer are made of semiconductor materials capable for forming a heterojunction;
- the source electrode, the drain electrode and the gate electrode are made of metal; and
- the source electrode and drain electrode form ohmic contact with barrier layer; and
- the gate electrode and the barrier layer form Schottky contact.

* * * * *